(12) United States Patent
Laulanet et al.

(10) Patent No.: US 12,332,303 B2
(45) Date of Patent: Jun. 17, 2025

(54) BUILT-IN SELF TEST WITH CURRENT MEASUREMENT FOR ANALOG CIRCUIT VERIFICATION

(71) Applicant: SEMICONDUCTOR COMPONENTS INDUSTRIES, LLC, Scottsdale, AZ (US)

(72) Inventors: Francois Laulanet, Brussels (BE); Jorg Jos Daniels, Outgaarden (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 173 days.

(21) Appl. No.: 18/468,456

(22) Filed: Sep. 15, 2023

(65) Prior Publication Data

US 2025/0093409 A1    Mar. 20, 2025

(51) Int. Cl.
*G01R 31/3187*     (2006.01)
*G01R 31/28*       (2006.01)

(52) U.S. Cl.
CPC ..... *G01R 31/2884* (2013.01); *G01R 31/2894* (2013.01)

(58) Field of Classification Search
CPC .......... G01R 31/2884; G01R 31/2894
See application file for complete search history.

(56) References Cited

U.S. PATENT DOCUMENTS

| | | |
|---|---|---|
| 9,739,834 B1 | 8/2017 | Azimi et al. |
| 2005/0242980 A1 | 11/2005 | Collins et al. |
| 2006/0250153 A1 | 11/2006 | Colbeck |
| 2010/0313089 A1 | 12/2010 | Rajski et al. |
| 2016/0336761 A1* | 11/2016 | Hsu ........................ H02J 7/0047 |
| 2018/0059177 A1 | 3/2018 | Pigott |
| 2019/0109480 A1* | 4/2019 | Hsu ........................... H02J 7/00 |
| 2021/0159689 A1* | 5/2021 | Faxvog ................... H02H 5/005 |
| 2021/0208197 A1* | 7/2021 | Lakshmanan ...... G01R 31/2884 |
| 2023/0280395 A1* | 9/2023 | Munzer .............. G01R 31/2856 |
| | | 324/750.3 |

* cited by examiner

*Primary Examiner* — Thang X Le
(74) *Attorney, Agent, or Firm* — Ramey LLP

(57) ABSTRACT

Illustrative integrated circuit devices are provided with built-in self test circuit designs and verification methods. One disclosed integrated circuit device includes: an analog circuit block configured to be powered by a current flow from a first power rail and an intermediate node; a current sensor configured to provide digital measurements of the current flow; a built-in self test circuit configured to set the analog circuit block in a sequence of operating modes and coupled to the current sensor to capture for each operating mode a corresponding one of the digital measurements.

20 Claims, 3 Drawing Sheets

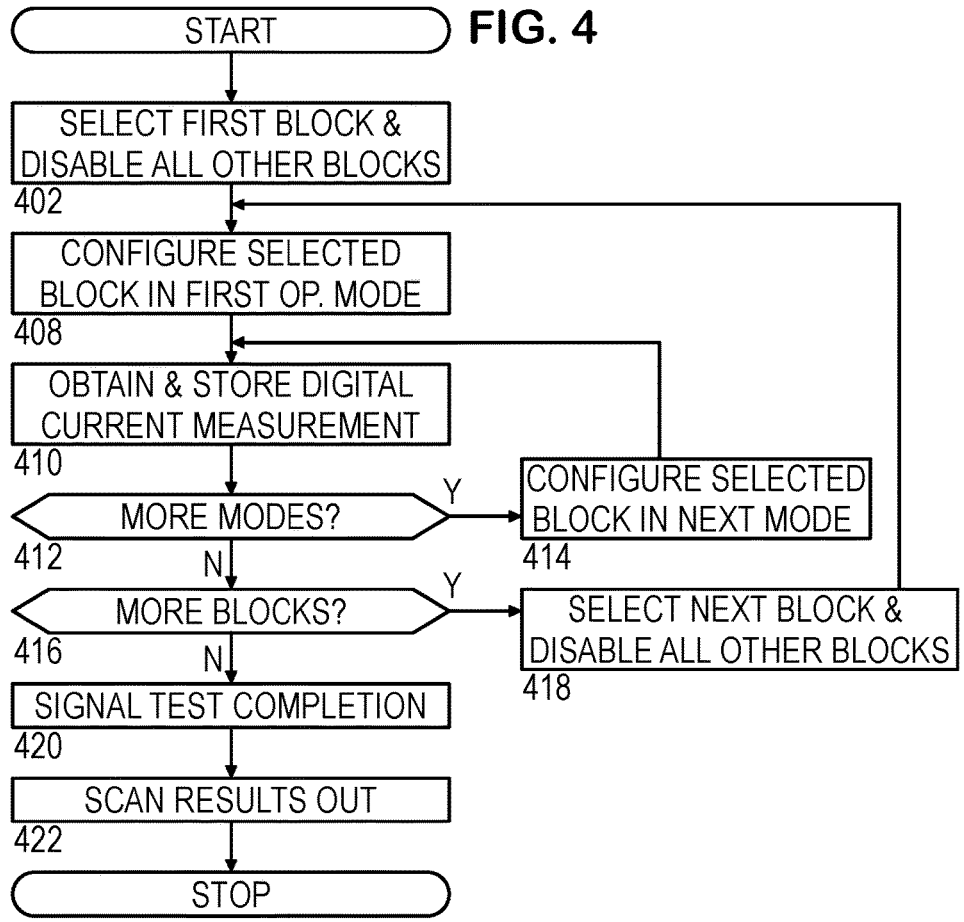
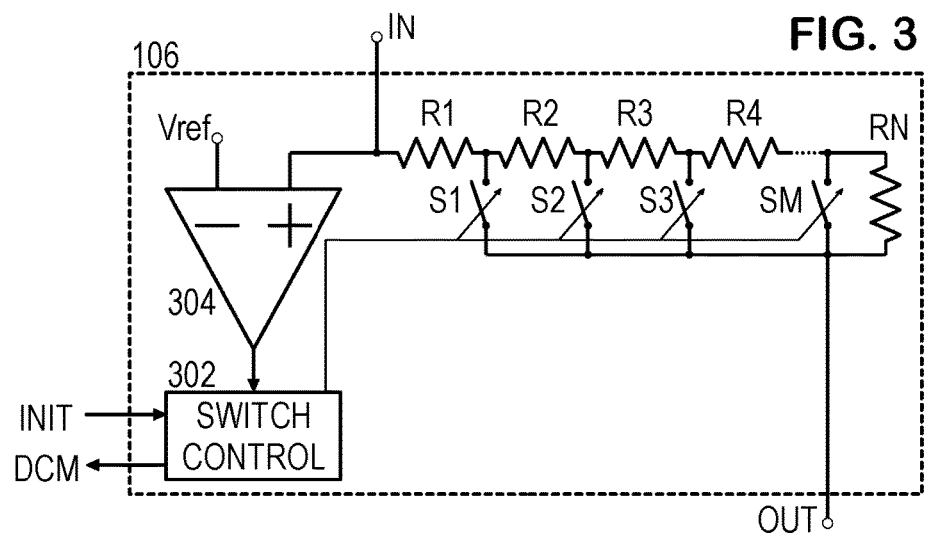

BUILT-IN SELF TEST WITH CURRENT MEASUREMENT FOR ANALOG CIRCUIT VERIFICATION

TECHNICAL FIELD

The present disclosure relates in general to integrated circuit testing and, more particularly, to an efficient method and design for quiescent-current-based or operating-current-based verification of analog circuit components.

BACKGROUND

The manufacturing process for integrated circuit devices involves the application of repeated patterning, deposition, and etching steps to a semiconductor wafer or other substrate to form interconnected structures that operate as analog and/or digital components of an electronic circuit. Despite ever-improving methods, the manufacturing process still suffers from statistical variations in pressure, temperature, and composition, not to mention equipment power, vibration, wear, and breakage, any of which can cause variations in layer alignment, thickness, and composition. Though the manufacturing process includes some tolerance for such variations, the complexity and number of integrated devices formed from each wafer leads to a non-negligible percentage of devices having impaired or faulty operation.

A number of techniques have been developed to enable faulty devices to be detected and discarded or repurposed, including automated test equipment (ATE) which can be used alone but is more commonly employed in combination with built-in self test (BIST) circuitry. When employed without BIST circuitry, the ATE applies various signals to the external input terminals of the device under test (DUT) and compares the DUT's resulting external outputs to their expected values. Without BIST circuitry, the testing process is limited to the DUT's external terminals, often preventing the testing process from providing adequate test coverage (meaning that many defects may not be detected by the test). With BIST circuitry, the testing process is able to access internal nodes and achieve better test coverage and is not limited to a clock rate that supports off-chip communication. Typically the test results are exported to the external tester (i.e., the ATE) via a serial bus for evaluation.

Various standards have been developed to enable ATE to access BIST circuitry, including the Institute of Electrical and Electronics Engineers (IEEE) Standard 1149.1 (commonly known as "JTAG"). These standards employ a serial bus in combination with one or more internal "scan chains". A scan chain is a shift register that passes its contents from one memory cell to the next to load the test input data and later to export the test result data. Various internal components of the DUT are configured to operate on portions of the shift register contents and to return their results, typically to the same shift register locations. The ATE retrieves and evaluates the test results, checking for incorrect bits that would indicate improper operation of digital circuitry components.

Though attempts have been made to develop similar testing processes for analog circuitry, they are infeasibly slow, complex, and/or costly in terms of their areal requirements relative to the circuitry being tested.

SUMMARY

Accordingly, there are disclosed herein illustrative built-in self test circuit designs and verification methods for integrated circuit devices. One disclosed integrated circuit device includes: an analog circuit block configured to be powered by a current flow from a first power rail and an intermediate node; a current sensor configured to provide digital measurements of the current flow; a built-in self test circuit configured to set the analog circuit block in a sequence of operating modes and coupled to the current sensor to capture for each operating mode a corresponding one of the digital measurements.

An illustrative method for testing multiple integrated circuit devices from a given manufacturing batch includes for each of the multiple integrated circuit devices: powering an analog circuit block with a current flow from a first power rail; iterating through a sequence of operating modes for the analog circuit block; for each operating mode in the sequence, storing a corresponding digital measurement of the current flow; transferring a device signature that includes the stored digital measurements to an external tester; failing the integrated circuit device if the device signature is not consistent with device signatures of other ones of the multiple integrated circuit devices.

Another disclosed integrated circuit device includes: multiple analog circuit blocks each coupled between a first power rail and an intermediate node; a current sensor coupled between the intermediate power node and a second power rail, the current sensor configured to provide digital measurements of current flow between the intermediate power node and the second power rail; and a sequencer configured to iterate through the multiple analog circuit blocks, enabling one at a time pursuant to a test pattern, the test pattern further specifying a sequence of operating modes for the enabled analog circuit block, and the sequencer further configured to capture a corresponding digital measurement for each operating mode of each analog circuit block.

Each of the foregoing devices, designs, and methods, can be employed individually or in conjunction and may include one or more of the following features in any suitable combination: 1. a current sensor having a resistor bank that couples the intermediate node to a second power rail and configured to convert the current flow into a voltage drop. 2. a comparator configured to compare the voltage drop to a fixed reference voltage. 3. a controller configured to determine the digital measurements by iteratively adjusting the resistor bank based on the comparator's output. 4. the analog circuit block is one of multiple analog circuit blocks each having a corresponding sequence of operating modes to be set by the built-in self test circuit, each of the multiple analog circuit blocks configured to be powered by current flow from the first power rail to the intermediate node. 5. the built-in self test circuit is configured to capture the digital measurements for a given one of the multiple analog circuit blocks while disabling the other ones of the multiple analog circuit blocks. 6. the sequence of operating modes is specified by a test pattern imported to the built-in self test circuit. 7. the built-in self test circuit is configured to export a device signature including the captured digital measurements. 8. the built-in self test circuit includes memory configured to store the test pattern and the captured digital measurements. 9. the built-in self test circuit includes a sequencer configured to set each operating mode in the sequence of operating modes for the analog circuit block and to store the corresponding one of the digital measurements in the memory. 10. the manufacturing batch corresponds to the devices patterned on a given wafer. 11. the transferring includes communicating the device signature to the external tester via a serial test bus. 12. the device signature is determined to be not consistent if a maximum absolute difference between corresponding digital measurements of different integrated circuit devices falls below a predetermined threshold. 13. a controller configured to adjust the resistor bank as needed for the voltage drop to converge to the fixed reference voltage. 14. a bypass switch for the resistor bank configured to disable the current sensor when closed. 15. a memory; and a built-in self test interface coupled to the memory to store the test pattern and to export a device signature that includes the digital measurements for each operating mode of each analog circuit block.

BRIEF DESCRIPTION OF THE DRAWINGS

FIG. 3. is circuit schematic of an illustrative current sensor.

FIG. 4 is a flow diagram of an illustrative built-in self testing method.

DETAILED DESCRIPTION

The following description and accompanying drawings are provided for explanatory purposes, not to limit the disclosure. To the contrary, they provide the foundation for one of ordinary skill in the art to understand all modifications, equivalents, and alternatives falling within the scope of the claims.

Figure 1:
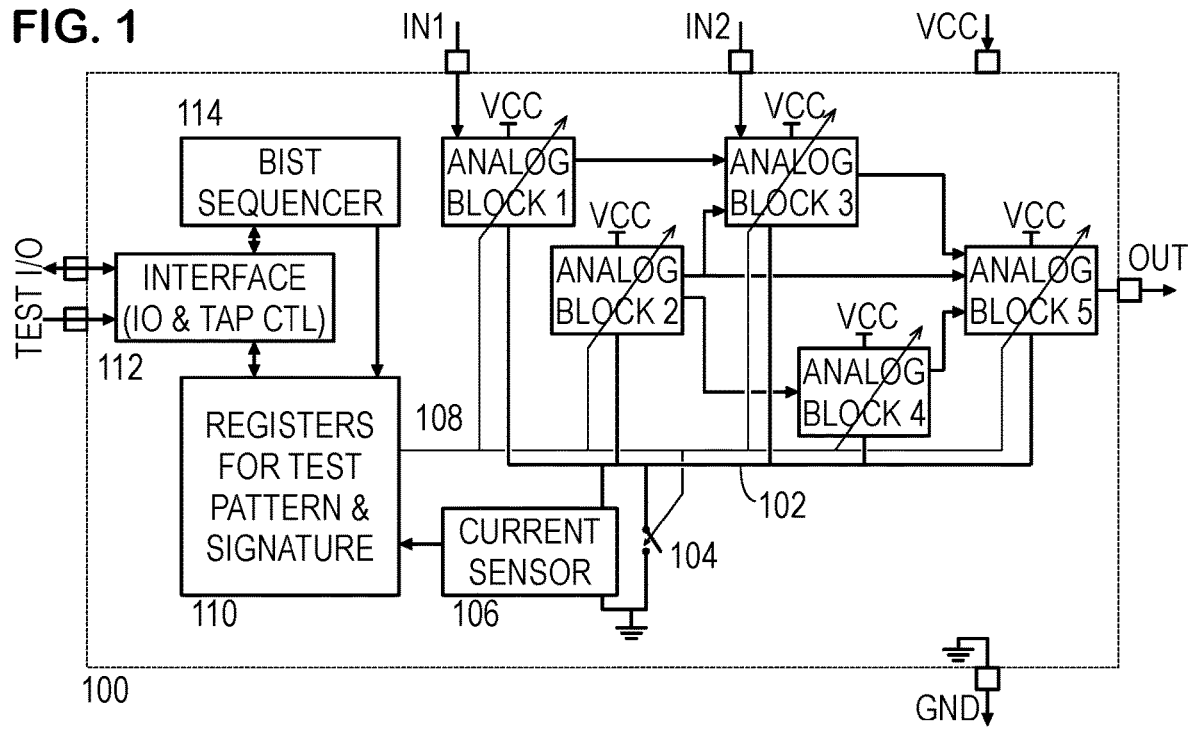
FIG. 1 is a block diagram of an illustrative integrated circuit device having low-side current measurement.

FIG. 1 is a block diagram of an illustrative integrated circuit device 100 having multiple analog circuit blocks 1-5. Though the specific purpose and arrangement of the multiple analog circuit blocks 1-5 is not relevant to the present disclosure, suitable examples of the integrated circuit device would include power modules (e.g., voltage and current regulators, voltage converters, AC-DC converters, gate drivers, LED drivers, ground fault circuit interruptor (GFCI) controllers, voltage references, battery managers), signal conditioners (e.g., amplifiers, filters, re-drivers, analog to digital converters), sensors (e.g., inductive sensors, capacitive sensors, photodetectors, temperature sensors, accelerometers, ultrasonic sensors), motor controllers, and interfaces (e.g., ethernet controllers, wired & wireless transceivers, optocouplers, automotive bus controllers). Suitable examples of the analog circuit blocks 1-5 include voltage references, current sources, oscillators, mixers, analog filters, amplifiers, analog to digital converters, digital to analog converters, amplifiers, switches, integrated sensors (including MEMS), etc., collectively arranged to implement the desired function of the integrated circuit device 100. The integrated circuit device may further include digital circuitry, which can be tested using existing techniques.

Each of the multiple analog circuit blocks 1-5 is coupled between a first power rail VCC and an intermediate node 102 to draw current for its operation. When closed, a bypass switch 104 couples the intermediate power node 102 to a second power rail GND to complete the power circuit for each of the multiple analog circuit blocks 1-5. When the bypass switch 104 is open, the current reaches the second power rail via a current sensor 106. Thus, bypass switch 104 enables the current sensor 106 when open and disables or bypasses the current sensor 106 when closed.

Each of the multiple analog circuit blocks 1-5 may be placed into a default state via a control bus 108. The default state may be, for example, a disabled state which can be achieved by interrupting the block's connection to the intermediate node 102 or otherwise preventing the block from drawing any current flow from either of the power rails. Alternatively, the default state may be one in which all analog signal inputs are held at ground (GND) voltage. Alternatively, the default state may be one in which all analog signal inputs are held at the supply voltage (VCC) or at any other arbitrary reference voltage. Alternatively, the default state may be customized to the individual block. In any case, the default state may be different for different ones of the multiple analog circuit blocks 1-5.

Each of the multiple analog circuit blocks 1-5 may be placed into one or more different operating modes. An operating mode is one in which the block is active and able to draw current flow from either of the power rails. Some blocks, such as a bandgap voltage reference, may have only one operating mode. Others, such as an amplifier, may have multiple operating modes, e.g., a first operating mode with an input near the supply voltage and a second operating mode with that input near the ground voltage. As a rule of thumb, those blocks that apply analog input signals to transistor gates or bases may employ at least two operating modes, one of which applies a signal voltage sufficient to place the transistor into a conductive state and another of which applies a signal voltage sufficient to place the transistor into a nonconductive state.

Additional operating modes may be employed to test different input signal combinations and/or to test intermediate input signal voltages too. For example, a differential amplifier may be tested with a positive and negative differential input signal at each of a high common mode voltage and a low common mode voltage.

The illustrative integrated circuit device 100 includes a built-in self test (BIST) circuit that includes a memory 110, a test input/output (Test I/O) interface 112, and a BIST sequencer 114. The control bus 108 may carry signals from memory 110, represented as a selected test vector from a test pattern stored via the Test I/O interface 112. The Test I/O interface 112 may support any standard communications and testing protocol, including scan chains or other serial buses such as Inter-Integrated Circuit (I2C), Management Data Input/Output (MDIO), Joint Test Action Group (JTAG), and test access port (TAP), which enable external automated test equipment (ATE) to provide test patterns, initiate the testing process, and receive the stored test results. A built-in self test sequencer 114 steps through the test pattern in memory 110, applying one test vector at a time as signals on bus 108 and obtaining the corresponding measurement of the quiescent current or operating current from current sensor 106. The current measurements (e.g., digital measurements of current flow) are stored in memory 110 to form the device's test signature. When the testing is complete, the ATE can read the test signature via the Test I/O bus.

The multiple analog circuit blocks 1-5 may be tested one at a time, in a sequence specified by the test pattern. While testing a given one of the multiple analog circuit blocks 1-5, the remaining analog circuit blocks may be disabled or placed in a default state. For each of the multiple analog circuit blocks 1-5, the test pattern specifies a respective sequence of one or more operating modes, and the memory 110 captures a digital measurement of the current flow for each operating mode. The digital measurements are maintained in an order corresponding to the sequences of operating modes within the sequence of blocks, and collectively the digital measurements form the device's test signature.

Due to the previously mentioned process variations, some variation is expected in the operating characteristics of different integrated circuit devices. Nevertheless, a high degree of consistency is expected for certain components and block types. For example, voltage references are designed to be consistent from device to device, and comparators that rely on a voltage reference for a comparison threshold are expected to exhibit a corresponding consistency. The resistance of integrated circuit resistors generally demonstrates a high degree of consistency at least among the integrated circuit devices manufactured on the same semiconductor wafer batch. Accordingly, a current sensor designed to employ such components may achieve current measurements that are precise and consistent among the integrated circuit devices from a given batch, e.g., the devices patterned on a given wafer. A design that provides a consistent and minimal voltage drop across the current sensor over a wide current range can further minimize any nonlinearities or other sources of current measurement inaccuracy.

The testing can be performed after the integrated circuit devices have been packaged, or it can be performed before singulation of the wafer. For packaged integrated circuit devices, the ATE relies on the pins or other contacts of the package including those for the Test I/O. For unsingulated devices, the ATE may employ probes that connect to the integrated circuit device contacts on the surface of the wafer.

Figure 2:
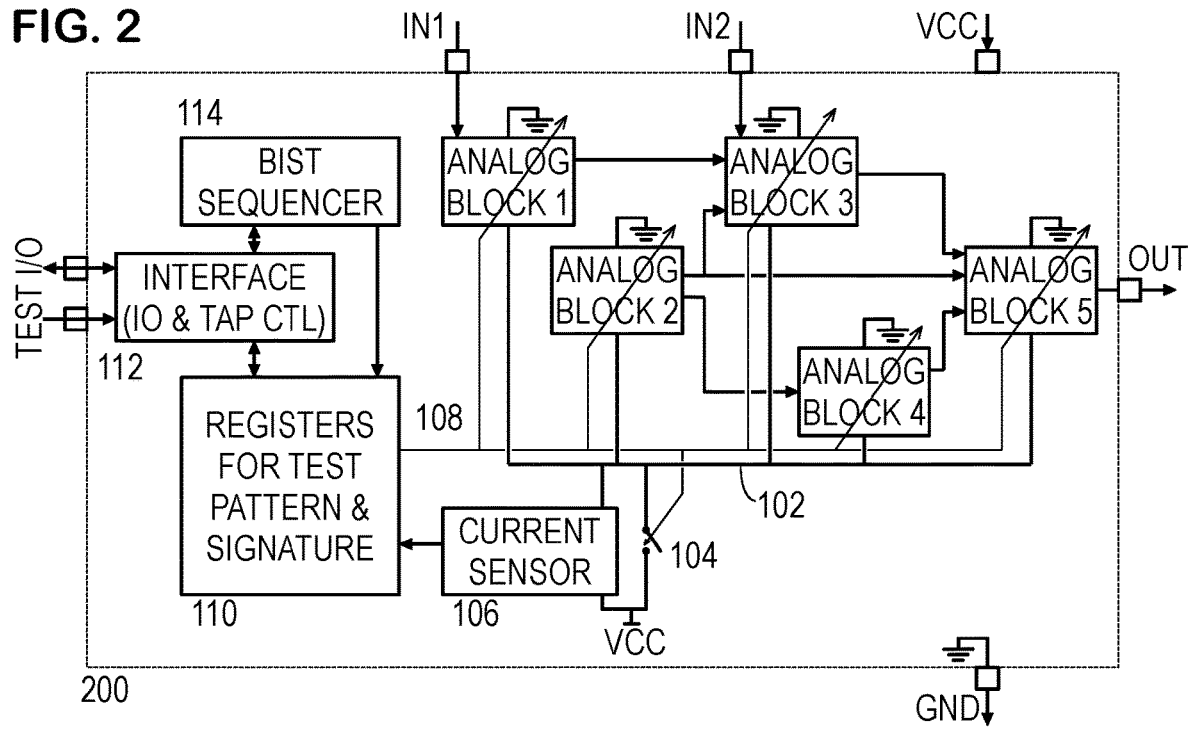
FIG. 2 is a block diagram of an illustrative integrated circuit device having high-side current measurement.

The illustrative integrated circuit device 100 employs low-side current sensing, i.e., the current sensor 106 is coupled between the intermediate node 102 and the lower voltage power rail GND. FIG. 2 shows an alternative integrated circuit device 200 that employs high-side current sensing, i.e., the current sensor 106 is coupled between the intermediate node 102 and the higher voltage power rail VCC. Similar to FIG. 1, where the multiple analog circuit blocks 1-5 are powered by current flow from the upper voltage power rail VCC to the intermediate node 102, the multiple analog circuit blocks 1-5 in FIG. 2 are powered by current flow between the intermediate node 102 and the lower voltage power rail GND.

FIG. 3 is a schematic of an illustrative current sensor 106 that may be employed for either high-side or low-side current sensing. In the illustrated implementation, the measured current flow is from the higher-voltage input node IN to the lower-voltage output node OUT. The current sensor 106 includes a bank of resistors R1-RN that, in combination with an array of switches S1-SM, provides a configurable resistance. To simplify the explanation, the illustrated implementation has the resistors R1-RN arranged in series between the input node IN and the output node OUT, creating a ladder of intermediate nodes that can each be coupled to the output node OUT to bypass one or more of the resistors. If the resistors have equal values, this arrangement enables the resistor bank to provide N−1 equally spaced resistance values. The resistor bank can employ alternative resistor arrangements, e.g., placing some or all of the resistors, potentially with different resistance values, in selectable parallel combinations. Such alternative arrangements may offer a significant reduction in component count and thus a reduction in the areal requirement.

The array of switches S1-SM is set by switch control 302 (e.g., a controller), which in response to an initiate signal (INIT) begins systematically varying the switch settings based on the output of comparator 304. Per Ohm's Law, the effective resistance of the resistor bank converts the current flow into a voltage drop V=IR. Comparator 304 compares the voltage drop across the resistor bank to a predetermined reference voltage Vref, asserting its output when the voltage drop exceeds the reference voltage and de-asserting its output when the voltage drop falls below the reference voltage. The voltage drop V is the product of the current flow I and the resistance R of the resistor bank as determined by the selected switch configuration. In at least some implementations, the switch control 302 performs a binary search, first determining whether the switch configuration that provides a half-maximum resistance produces a voltage drop above or below the fixed reference voltage Vref. Depending on the comparator output, the switch control 302 sets or clears a first bit of the digital current measurement (DCM) and sets the switches to raise or lower the effective resistance by a quarter of the maximum. Again, depending on the comparator output, the switch control 302 sets or clears a second bit of the DCM and sets the switches to raise or lower the effective resistance by an eighth of the maximum. This process of iteratively adjusting the resistor bank based on the comparator's output is repeated until the switch control 302 has determined all bits of the DCM, at which point the voltage drop across the resistor bank has converged as closely as possible to the reference voltage Vref. The time needed to obtain a current measurement for a given operating mode may be on the order of a few microseconds.

As previously mentioned, the reference voltage Vref may be kept relatively small, yet large enough to permit the use of a relatively low complexity comparator design. In a design that employs a switched input configuration that enables offset measurement and compensation, a reference voltage of about 100 mV would be suitable. Any suitable offset compensation or auto-zeroing technique can be used. Note that to ensure the current measurement is representative of normal operating conditions, the supply voltage may be increased to compensate for the voltage drop across the resistor bank, e.g., a 3 volt nominal supply voltage may be increased to 3.1 volts during the testing process.

FIG. 4 is a flow diagram of an illustrative testing method that may be implemented by the integrated circuit devices 100, 200. It is initiated by the ATE after the test pattern has been imported into the built-in self test circuit memory 110 to specify the sequence of analog circuit blocks to be tested and the sequences of operating modes to be applied to each analog circuit block. It begins in block 402, with the sequencer 114 causing the control bus 108 to select a first of the multiple analog circuit blocks 1-5 and to disable the rest. In block 408, the sequencer then causes the control bus 108 to place the selected analog circuit block in a first operating mode. In block 410, the sequencer initiates the measurement by the current sensor 106 and causes the memory 110 to capture or otherwise store the result. In block 412, the sequencer determines whether there are more operating modes for the currently selected block, and if so, the sequencer configures the selected block in the next operating mode in block 414 before returning to block 410. Otherwise, in block 416, the sequencer determines whether there are more analog circuit blocks, and if so, the sequencer selects the next analog circuit block in block 418 and disables the rest before returning to block 408. Once each analog circuit block has been configured in each operating mode of the corresponding sequence, the sequencer signals test completion in block 420. This signaling may be done with a register flag, or one of the Test I/O signal pins may be toggled. In block 422, the current measurements for each of the operating modes for each of the analog circuit blocks is exported as the integrated circuit device signature. The built-in self test circuit transfers the device signature via a serial test bus. In this fashion, the built-in self test circuitry iterates through the sequences of operating modes for the specified sequence of analog circuit blocks pursuant to the test pattern. This completes the process for the integrated circuit device, but the process continues with the ATE evaluating the current measurements, passing the integrated circuit devices having signatures that are consistent with each other or with an expected device signature and failing those that are not.

Figure 5:
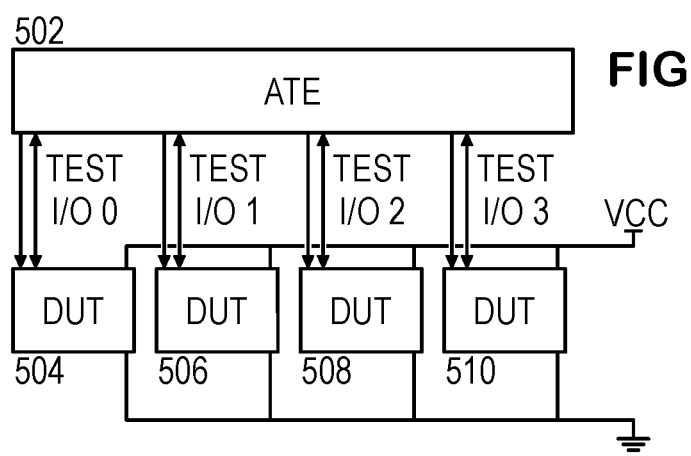
FIG. 5 shows an external tester coupled to multiple devices under test.

FIG. 5 shows an illustrative external tester 502 coupled to multiple devices under test 504, 506, 508, 510. For ease of illustration, the figure shows only four devices under test. In practice, the external tester (labeled here as automated test equipment ATE) 502 can connect to as many devices as its hardware will support. The external tester 502 may supply the test pattern concurrently to each of the multiple devices 504-510, initiate the built-in self test circuit, and once testing is complete, retrieve a device signature from each of the multiple devices 504-510. In this way, the ATE 502 may obtain an expected current measurement for each operating mode for each analog circuit block and may compare the measurements to their corresponding expected values. If the measurement deviates by more than a predetermined threshold, which can be expressed in terms of a percentage or in terms of an absolute value, the ATE 502 may determine that the integrated circuit device is faulty.

Examples of suitable predetermined thresholds include 1%, 2%, 5%, 10%, 10 nA, 20 nA, 50 nA, 100 nA, 250 nA, 0.5 µA, 1 µA, and the thresholds may be different for different operating modes. The ATE may further compare measurements between devices of a given batch and may determine whether any of the current measurements deviate from an average or median measurement by more than a predetermined threshold, e.g., whether the maximum absolute difference between the actual measurements in the device signature and the expected or average corresponding measurements falls below the predetermined threshold. The predetermined threshold for batch testing may differ from the predetermined threshold for expected measurements, and again, it may vary for different operating modes. If none of the actual measurements of a given integrated circuit device deviates by more than the predetermined thresholds, the ATE may determine that the measurements are consistent and may declare that the integrated circuit device has passed the verification test. Indications are that this process will detect over 99% of manufacturing faults, requiring minimal surface area of the die, and with the built-in current sensor the process can be performed expeditiously, i.e., in a fraction of the time of comparable testing by other means.

What is claimed is:

1. An integrated circuit device that comprises:
   an analog circuit block configured to be powered by a current flow between a first power rail and an intermediate node;
   a current sensor configured to provide digital measurements of the current flow; and
   a built-in self test circuit configured to set the analog circuit block in an operating mode from a sequence of operating modes and coupled to the current sensor to capture for each operating mode in the sequence a corresponding one of the digital measurements.

2. The integrated circuit device of claim 1, wherein the current sensor includes:
   a resistor bank that couples the intermediate node to a second power rail and configured to convert the current flow into a voltage drop;
   a comparator configured to provide an output indicating whether the voltage drop exceeds a fixed reference voltage; and
   a controller configured to iteratively adjust the resistor bank based on the output of the comparator to provide the digital measurements of current flow.

3. The integrated circuit device of claim 1, wherein the analog circuit block is one of multiple analog circuit blocks each having a corresponding sequence of operating modes to be set by the built-in self test circuit, each of the multiple analog circuit blocks configured to be powered by current flow from the first power rail to the intermediate node.

4. The integrated circuit device of claim 3, wherein the built-in self test circuit is configured to capture the digital measurements for a given one of the multiple analog circuit blocks while disabling all other ones of the multiple analog circuit blocks.

5. The integrated circuit device of claim 1, wherein the sequence of operating modes is specified by a test pattern input to the built-in self test circuit.

6. The integrated circuit device of claim 5, wherein the built-in self test circuit is configured to output a device signature including the digital measurements.

7. The integrated circuit device of claim 6, wherein the built-in self test circuit includes memory configured to store the test pattern and the digital measurements.

8. The integrated circuit device of claim 7, wherein the built-in self test circuit includes a sequencer configured to iterate through the sequence of operating modes for the analog circuit block and to store the corresponding one of the digital measurements in the memory.

9. A method that comprises testing multiple integrated circuit devices from a given manufacturing batch, the testing including, for each of the multiple integrated circuit devices:
   powering an analog circuit block with a current flow from a first power rail;
   iterating through a sequence of operating modes for the analog circuit block;
   for each operating mode in the sequence, storing a digital measurement of the current flow corresponding to that operating mode;
   transferring a device signature that includes the stored digital measurements to an external tester; and
   failing the integrated circuit device if the device signature is not consistent with device signatures of other ones of the multiple integrated circuit devices.

10. The method of claim 9, wherein the given manufacturing batch comprises the multiple integrated circuit devices patterned on a given wafer.

11. The method of claim 9, further comprising obtaining the digital measurements by:
   comparing a reference voltage to a voltage drop from a resistor bank that couples an intermediate node to a second power rail; and
   iteratively adjusting the resistor bank based on said comparing.

12. The method of claim 9, wherein the analog circuit block is one of multiple analog circuit blocks in the integrated circuit device, and wherein the method further includes importing a test pattern that specifies for each analog circuit block in the multiple analog circuit blocks a corresponding sequence of operating modes.

13. The method of claim 12, wherein the method includes disabling the other ones of the multiple analog circuit blocks during said iterating through the sequence of operating modes for the analog circuit block.

14. The method of claim 13, wherein said transferring includes communicating the device signature to the external tester via a serial test bus.

15. The method of claim 9, wherein the device signature is determined to be not consistent if a maximum absolute difference between corresponding digital measurements of different integrated circuit devices falls below a predetermined threshold.

16. An integrated circuit device that comprises:
    multiple analog circuit blocks each coupled between a first power rail and an intermediate power node;
    a current sensor coupled between the intermediate power node and a second power rail, the current sensor configured to provide digital measurements of current flow between the intermediate power node and the second power rail; and
    a sequencer configured to iterate through the multiple analog circuit blocks, enabling one at a time pursuant to a test pattern, the test pattern further specifying a sequence of operating modes for the enabled analog circuit block, and the sequencer further configured to capture a digital measurement of the current flow for each operating mode of each analog circuit block.

17. The integrated circuit device of claim 16, wherein the current sensor includes:
    a resistor bank that couples the intermediate node to the second power rail and configured to convert the current flow into a voltage drop;
    a comparator configured to compare the voltage drop to a fixed reference voltage; and
    a controller configured to adjust the resistor bank as needed for the voltage drop to converge to the fixed reference voltage.

18. The integrated circuit device of claim 17, further comprising a bypass switch for the resistor bank configured to disable the current sensor when closed.

19. The integrated circuit device of claim 16, further comprising:
    a memory; and
    a built-in self test interface coupled to the memory to store the test pattern and to output a device signature that includes the digital measurements for each operating mode of each analog circuit block.

20. The integrated circuit device of claim 17, wherein the controller is configured to adjust the resistor bank in accordance with a binary search.

* * * * *